(12) United States Patent
Parkhe et al.

(10) Patent No.: US 12,353,445 B2
(45) Date of Patent: *Jul. 8, 2025

(54) FEATURE STORE WITH INTEGRATED TRACKING

(71) Applicant: Databricks, Inc., San Francisco, CA (US)

(72) Inventors: Mani Parkhe, San Jose, CA (US); Clemens Mewald, Lafayette, CA (US); Matei Zaharia, Palo Alto, CA (US); Avesh Singh, San Francisco, CA (US)

(73) Assignee: Databricks, Inc., San Francisco, CA (US)

( * ) Notice: Subject to any disclaimer, the term of this patent is extended or adjusted under 35 U.S.C. 154(b) by 245 days.

This patent is subject to a terminal disclaimer.

(21) Appl. No.: 17/514,997

(22) Filed: Oct. 29, 2021

(65) Prior Publication Data
US 2022/0374457 A1 Nov. 24, 2022

Related U.S. Application Data

(60) Provisional application No. 63/191,705, filed on May 21, 2021.

(51) Int. Cl.
*G06F 16/28* (2019.01)
*G06F 30/27* (2020.01)

(52) U.S. Cl.
CPC ............ *G06F 16/288* (2019.01); *G06F 30/27* (2020.01)

(58) Field of Classification Search
CPC .............................. G06F 16/288; G06F 30/27
See application file for complete search history.

(56) References Cited

U.S. PATENT DOCUMENTS

| | | | |
|---|---|---|---|
| 9,990,639 B1 * | 6/2018 | Kong | G06Q 50/16 |
| 11,373,119 B1 | 6/2022 | Doshi et al. | |
| 11,651,212 B2 | 5/2023 | Xu et al. | |
| 11,704,299 B1 * | 7/2023 | Bansal | G06N 5/025 |
| | | | 707/802 |
| 11,928,182 B1 | 3/2024 | Arici et al. | |
| 12,242,928 B1 | 3/2025 | Chen et al. | |
| 2002/0165724 A1 * | 11/2002 | Blankesteijn | G06F 16/2308 |
| | | | 705/1.1 |
| 2003/0084053 A1 | 5/2003 | Govrin et al. | |
| 2012/0246619 A1 | 9/2012 | Thirumalai et al. | |
| 2013/0111016 A1 | 5/2013 | Wilson et al. | |
| 2013/0262483 A1 * | 10/2013 | Blom | G06F 16/9535 |
| | | | 707/E17.058 |

(Continued)

FOREIGN PATENT DOCUMENTS

WO WO 2022/128110 A1 6/2022

OTHER PUBLICATIONS

Dankers, Frank JWM, et al. "Prediction modeling methodology." Fundamentals of clinical data science (2019): 101-120 (Year: 2019).*

(Continued)

*Primary Examiner* — Mohsen Almani
(74) *Attorney, Agent, or Firm* — Fenwick & West LLP

(57) ABSTRACT

The present application discloses a method, system, and computer system for managing a plurality of features and storing lineage information pertaining to the features. The method includes obtaining one or more datasets, determining a first feature, wherein the first feature is determined based at least in part on the one or more datasets, and storing the first feature in a feature store. The first feature is stored in association with a dataset indication of the one or more datasets from which the first feature is determined. The feature store comprises a plurality of features.

20 Claims, 12 Drawing Sheets

(56) References Cited

U.S. PATENT DOCUMENTS

| | | | |
|---|---|---|---|
| 2015/0379072 A1* | 12/2015 | Dirac | G06N 20/00 |
| | | | 707/693 |
| 2015/0379429 A1 | 12/2015 | Lee et al. | |
| 2016/0048850 A1 | 2/2016 | Wooten | |
| 2017/0124487 A1 | 5/2017 | Szeto et al. | |
| 2017/0295217 A1 | 10/2017 | Anderson | |
| 2018/0373781 A1 | 12/2018 | Palrecha | |
| 2022/0019496 A1 | 1/2022 | Lozano et al. | |
| 2022/0101192 A1* | 3/2022 | Patel | G06N 7/01 |
| 2022/0129727 A1* | 4/2022 | Chen | G06N 3/08 |
| 2022/0197306 A1* | 6/2022 | Cella | B25J 9/1661 |

OTHER PUBLICATIONS

Frank E, Hall M, Trigg L, Holmes G, Witten IH. Data mining in bioinformatics using Weka. Bioinformatics. Oct. 12, 2004;20(15):2479-81. (Year: 2004).*

Vargas, Luis, Jean Bacon, and Ken Moody. "Integrating databases with publish/subscribe." 25th IEEE International Conference on Distributed Computing Systems Workshops. IEEE, 2005. (Year: 2005).*

Blackstock, Michael, and Rodger Lea. "Toward a distributed data flow platform for the web of things (distributed node-red)." Proceedings of the 5th International Workshop on Web of Things. 2014. (Year: 2014).*

Knuth, Magnus, et al. "Towards linked data update notifications." Workshop on negative or inconclusive results in semantic web (NoISE'15), Portoroz, Slovenia. 2015. (Year: 2015).*

PCT International Search Report and Written Opinion, PCT Application No. PCT/US2022/027387, Aug. 16, 2022, nine pages.

United States Office Action, U.S. Appl. No. 18/162,625, Dec. 14, 2023, 13 pages.

Graham, et al., "Web Services Base Notification 1.3," Oasis Standard, Oct. 1, 2006, pp. 1-68.

Vinoski, Steve, "Web Services Notifications," Iona Technologies, IEEE Internet Computing, 8.2, Mar.-Apr. 2004, pp. 86-90.

* cited by examiner user_features.behavior ▼ Provide Feedback
Feature Store > user_features.behavior

| Created: 2021-05-09 10:51:46 | Created by: clemons@databricks.com | Partition Keys: | Data Sources: store.users | Producer Links: rec_sensorflow |
|---|---|---|---|---|
| Modified by: clemons@databricks.com | | Primary Keys: ts | | |

| | Cloud ⬥ | Storage ⬥ | Jobs | Notebooks |
|---|---|---|---|---|
| | AWS | MYSQL | - | ▤ rec_dashboard |
| | | | - | ▤ rec_dashboard |
| | | | - | ▤ rec_dashboard |
| | | | - | ▤ rec_dashboard |

▼ Features (5)

| Feature ⬥ | Data type ⬥ | Models | Endpoints |
|---|---|---|---|
| ts | INTEGER | ⬥ rec_model_tf/1 | - |
| last_visit | STRING | ⬥ rec_model_tf/1 | - |
| avg_session_time | FLOAT | ⬥ rec_model_tf/1 | ⬥ rec_model_tf/1 |
| category_vector | STRING | ⬥ rec_model_tf/1 | ⬥ rec_model_tf/1 |

| Feature ⬥ | Data type ⬥ | Models | Endpoints |
|---|---|---|---|
| ts | INTEGER | ⬥ rec_model_tf/1 | - |
| last_visit | STRING | ⬥ rec_model_tf/1 | - |
| avg_session_time | FLOAT | ⬥ rec_model_tf/1 | ⬥ rec_model_tf/1 |
| category_vector | STRING | ⬥ rec_model_tf/1 | ⬥ rec_model_tf/1 |

600 unity_catalog / city_data /
⊞ Firehose ✎ — 602
[GDPR] ✎

Description ✎ — 604
This table contains raw events from across the LOC platform.
Use this table to find all reported game-play events

Recommendations ✎
Creating an index on ProductID may improve performance. Learn more.
Firehose has not been vacuumed in 90 days. Learn more. — 608

Owners     Frequent users
(SO)(AA)(PA)(JS)  (JD)(BT)(SB)(AD)

ABAC Policies ✎ — 606
☑ PII
☐ Cost
☑ Inventory — 610

Top Queries
Champions stats 1H 2021 — 612
Gameplay analysis Q2 2021
Gameplay hours LOC semi-finals
Purchase prediction model 2021

Statistics
Format    Delta △ — 614
Updated   5 hours ago (BT)
Created   1 year ago (SO)
Size      500 GB

[Open in SQL Editor]  [Grant Privileges]

Lineage — 618
inbndcall → Firehose → disp_rec
                    → inventory
[+][-][⛶]

Schema — 616
ProductID          Add Tag  integer
Status             Add Tag  string
PricingTier        Add Tag  [Inventory][Cost]  float
DistributionTier   Add Tag  string
Accountinfo        Add Tag  string  [PII]

Privileges ✎ — 620

| User / Group | Permissions | 
|---|---|
| bi_team | Select, Modify, Manage |
| dev | Select |

Data Sample — 622

| ProductID | Status | PricingTier | DistributionTier | Accountinfo | Modified |
|---|---|---|---|---|---|
| 135018 | active | Enterprise | P1 | 15 | 2021-05-20 15:56 |
| | | | | | 2021-05-12 10:25 |

FIG. 6A

Data Explorer

☐ Unity Catalog ⌄ ▪ default ⌄

Filter tables and columns...

- ⊞ am_big
- ⊞ am_Connections
- ⊞ am_iso_codes
- ⊞ aml_transactions
- ⊞ aml_test
- ⊞ codes
- ⊞ codes_test
- ⊞ connections_iso
- ⊞ customers
- ⊞ delta
- ⊞ edge
- ⊞ edge_data
- ⊞ edge_test
- ⊞ flight_delays
- ⊞ flight_pairs_stats
- ⊞ flight_pairs_stats_autoopt Schema last fetched: just now ⟳

● Data Team Endpoint (M) ⊙ ⌄

⊞ default.firehose
🗎 Comment:
👤 Owner:
Size:

Schema   Sample Data   Profile   Details   Permissions   Relationship   History

| Button 1 | Button 2 | | Filter |
|---|---|---|---|

| Name | Type | Comment |
|---|---|---|
| cr_returned_date_sk | int | |
| cr_returned_time_sk | int | |
| cr_item_sk | int | |
| cr_refunded_customer_sk | int | |
| cr_refunded_cdemo_sk | int | |
| cr_refunded_hdemo_sk | int | |
| cr_refunded_addr_sk | int | |
| cr_returning_customer_sk | int | |
| cr_returning_cdemo_sk | int | |
| cr_returning_hdemo_sk | int | |

FEATURE STORE WITH INTEGRATED TRACKING

CROSS REFERENCE TO OTHER APPLICATIONS

This application claims priority to U.S. Provisional Patent Application No. 63/191,705 entitled FEATURE STORE filed May 21, 2021 which is incorporated herein by reference for all purposes.

BACKGROUND OF THE INVENTION

A system for big data processing comprises a system for deployments of applications, configurations, one or more datasets, and model(s) used in connection with analyzing the data. Models are generally deployed in services and applications, such as web-based services, in connection with providing estimated outcomes, etc. A model is generated or trained based on relationships among different input data. At scale, models use numerous relationships among data, and the development of such relationships is very resource intensive. This creates a problem for maintaining relationships among data in memory for use across multiple models.

BRIEF DESCRIPTION OF THE DRAWINGS

Various embodiments of the invention are disclosed in the following detailed description and the accompanying drawings.

FIG. 5B is a diagram of an example of a feature store according to various embodiments of the present application.

FIG. 6A is a diagram of a user interface of a feature store according to various embodiments of the present application.

FIG. 6B is a diagram of a user interface of a feature store according to various embodiments of the present application.

DETAILED DESCRIPTION

Figure 1:
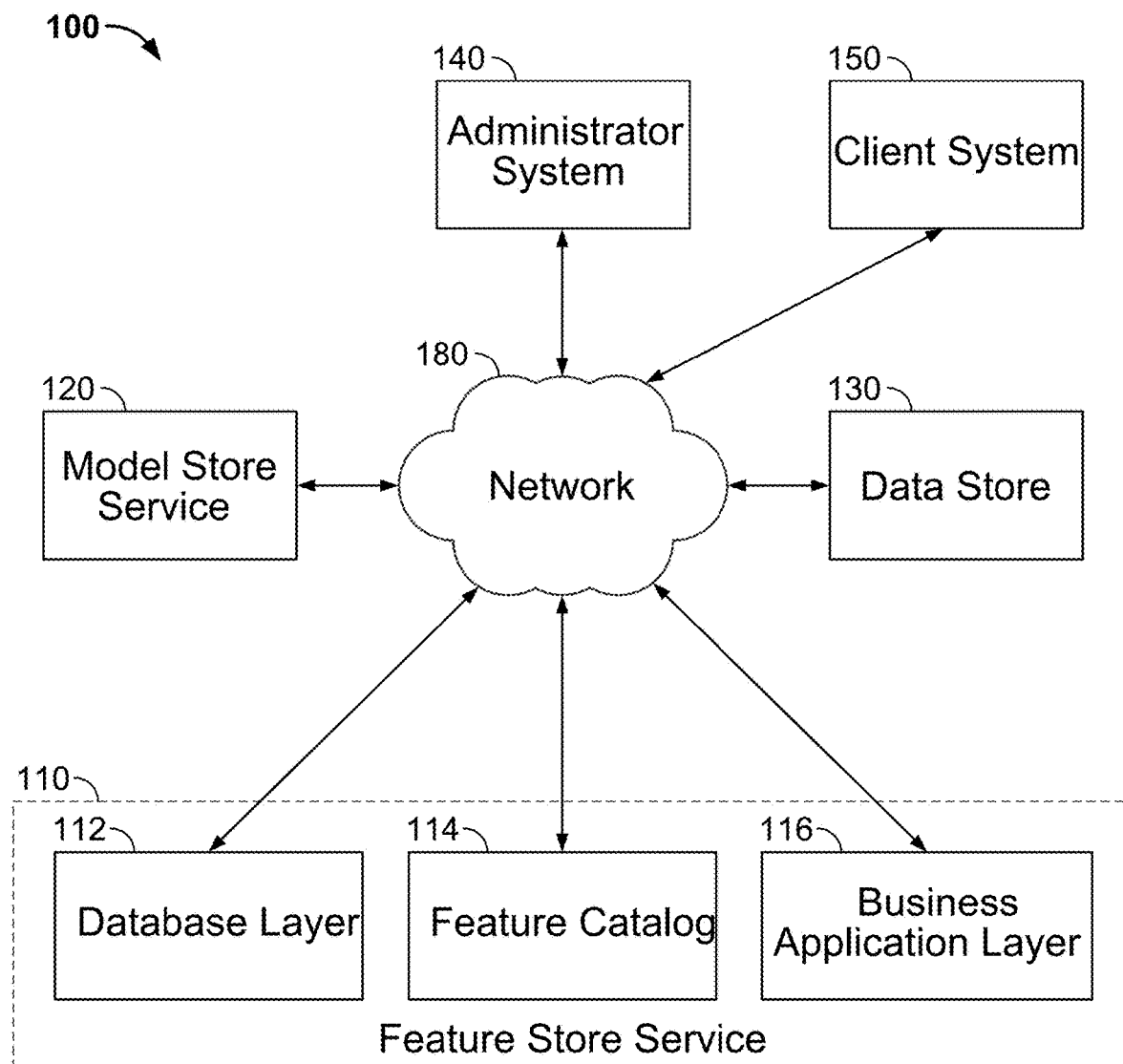
FIG. 1 is a block diagram of a network system according to various embodiments of the present application.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As used herein, a feature is a measureable property or characteristic manifested from input data, which may be raw data. As an example, a feature may be as set of one or more relationships manifested from the input data. In some embodiments, a feature is a result of a transformation of raw data. In various embodiments, a feature comprises an aggregation of a single or multiple rows in the input data.

According to various embodiments, a system for storing and managing a feature is disclosed. The system comprises one or more processors and a memory. The one or more processors are configured to obtain one or more datasets, determine a first feature, wherein the first feature is determined based at least in part on the one or more datasets, and store the first feature in a feature store. In some embodiments, the first feature is stored in association with a dataset indication of the one or more datasets from which the first feature is determined. In some embodiments, the feature store comprises a plurality of features.

According to various embodiments, a system and/or method for storing, managing, or updating a feature is deployed. In some embodiments, the feature store includes integrated tracking (e.g., feature use, associations of features and models, etc.). In various embodiments, a feature is stored in a feature store of a feature store service. The feature store may be a database layer of the feature store service. The feature store may store one or more features and store certain information pertaining to a stored feature (e.g., metadata associated with the feature). For example, the feature store comprises a mapping of features to information pertaining to one or more characteristics of features. Examples of the one or more characteristics of features include: (a) a dataset indication of the one or more datasets from which the particular feature is determined (such one or more datasets are also referred to herein as source data); (b) a date and/or a time the feature was last modified and/or updated; (c) an update frequency or some measure of freshness (e.g., where freshness comprises an indication that the feature is computed and updated on a regular interval) for the feature; (d) an indication of one or more models that use, or that are generated based at least in part on, the particular feature; (e) an indication of one or more endpoints that use a model that uses, or is generated based at least in part on, the particular feature; (f) a ranking of the feature; (g) a rating of the feature; (h) a measure of effectiveness of the particular feature; (i) a measure of accuracy of the particular feature; (j) an indication of at least part of the code used to determine (e.g., compute) the particular feature; (k) a developer or creator of the particular feature; (l) a measure of a popularity of the particular feature; (m) a version identifier; (n) a latency property associated with the particular feature; and (o) a code that uses (or that relies on) the feature. Various other characteristics of features can be stored in association with the corresponding feature in the feature store. In some embodiments, the mapping of a feature to information pertaining to one or more characteristics of the feature is updated based at least in part on an updating of the feature, an update or change of a source data corresponding to the feature, and/or an update to a use of the feature. For example, the feature store is updated to maintain a current upstream lineage of a feature to source data and/or a current downstream lineage of the feature to models, endpoints, or other places where the data can be processed that use or rely on the feature. As an example, the feature store is automatically updated to maintain the current upstream lineage, current downstream lineage, and/or status of a particular feature.

According to various embodiments, a feature (e.g., a feature stored and exposed by the feature store) is used in connection with training a model and/or deployment of a model such as for use with a service. In some embodiments, the set of one or more features used in connection with training a model is the same set of one or more features used in connection with deployment of the model. If different set of features were used in training a model and deployment of a model, the service relying on the model may experience data skew (e.g., because the information used in training the model and the information used in deployment of the model to output information such as an estimate would be inconsistent). In some embodiments, the feature store ensures that features are available and consistent for training for large scale and high throughput computation and for deployment at low latency (e.g., to avoid online/offline skew—where a difference arises between feature use when models are trained with offline or batch data versus when used in model prediction using different sources, code, or library in an online scoring environment).

According to various embodiments, the feature store service exposes the feature store (and the features stored therein) in connection with development of models and/or services. In some implementations, the feature store is exposed to users within an organization, a department, a development team, etc. In some implementations, the feature store is exposed across organizations, to a development community, or among customers of the feature store service. The feature store may store a mapping of permissions of users to features. For example, the permission to access or use a feature can be configured by a creator or administrator associated with the feature, or organization that owns the feature. As another example, the permissions with respect to a feature (or a set of features) can be configured (e.g., defined) to only be accessible or usable by a set of users having requisite permissions (e.g., a particular permission level or credential). The feature store service may include a business application layer that provides a user interface via which a user (e.g., a developer such as a developer for a model or web service) accesses the feature store (e.g., subject to the user's permissions, the user can view features in the feature store and/or information pertaining to the features such as one or more characteristics of the feature). According to various embodiments, the feature store service exposes features stored in the feature store in a searchable manner. In some embodiments, features stored in the feature store are searchable based at least in part on characteristics pertaining to the features (e.g., information associated with an upstream lineage and/or a downstream lineage associated with features). For example, the feature store service provides a user interface by which a user can search based at least in part on an identifier associated with a feature and/or one or more characteristics associated with a feature. For example, a user can use the user interface to search for a feature based at least in part on particular raw data used in determining one or more features.

According to various embodiments, the feature store comprises information pertaining to an upstream lineage and/or a downstream linage associated with the feature. In some embodiments, the feature store service stores the information pertaining to an upstream lineage and/or a downstream linage associated with the feature contemporaneous with developing, updating, changing, or using the feature. For example, if a user uses the feature store service to link the feature to a model (e.g., where the feature is used to train the model), the feature store service system automatically stores such link to the model as part of the downstream lineage of the feature. Storing the upstream lineage and/or the downstream linage in association with the corresponding feature improves the extent of information available to feature developers and feature adopters. For example, a feature developer can use information provided by the feature store to assess characteristics pertaining to the adoption of a particular feature by downstream endpoints or model, and such information can be used in connection with improving or updating the feature. As another example, a feature adopter can use information provided by the feature store to assess the manner by which the feature was developed (e.g., code used to develop the feature, the source data for the feature, etc.) and/or how others have adopted the feature (e.g., downstream endpoints such as services that rely on the features, a frequency of adoption, a measure of trust or accuracy of the feature, a measure of likeability of the feature, etc.). In some embodiments, the feature store provides a notice (e.g., an indication) if a feature is updated, changed, deleted, or otherwise no longer supported. For example, in the case that an endpoint such as a web service uses a model that relies on a feature that is deleted (or scheduled to be deleted), the feature store service provides a notice to the endpoint that the feature is deleted or no longer supported. As another example, in the case that an endpoint such as a web service uses a model that relies on a feature that is changed, the feature store service provides a notice to the endpoint that the feature is changed.

Determining (e.g., creating, developing, etc.) features is resources intensive. For example, developing a feature often takes a lot of developer effort and may rely on certain intellectual property of the organization for which a developer is developing the feature. In addition, some models are extremely complex and rely on large numbers of features. For example, some models use thousands of features. Because the development of features is so cumbersome and resource intensive, the exposure of developed features (e.g., features stored in the feature store) across users improves the efficiency of developing models or services that rely on features. Further, the complexity of developing features lends itself to introduction of human error. Thus, providing a feature store service that enables developers to store, search, and use pre-stored features reduces the likelihood that an error is introduced into the model (e.g., reducing the likelihood that developers introduce human errors into features). Developers can use the one or more characteristics of a feature to inform whether to use the feature in development of a model or service that relies on such feature. For example, a developer may develop a model or web service that relies on current data and thus the developer may determine to use a feature that has a high update frequency.

FIG. 1 is a block diagram of a network system according to various embodiments of the present application.

In the example illustrated in FIG. 1, system 100 includes feature store service 110, model store service 120, data store 130, administrator system 140, and/or client system 150. In some embodiments, feature store service 110, model store service 120, and data store 130 are integrated (e.g., combined into a layer or a single set of server(s)). In some embodiments, feature store service 110 comprises database layer 112, feature catalog 114, and/or business application layer 116. System 100 further includes one or more networks such as network 180 over which administrator system 140 and/or client system 150 communicates with feature store service 110, model store service 120, and/or data store service 130. In various embodiments, network 180 includes one or more of a wired network, and/or a wireless network such as a cellular network, a wireless local area network (WLAN), or any other appropriate network. In some embodiments, database layer 112, feature catalog 114, and/or business application layer 116 are respectively implemented by one or more servers. System 100 may include various other systems or terminals.

Feature store service 110 stores one or more features and information pertaining to the one or more features. For example, feature store service 110 stores one or more characteristics associated with the one or more features. The one or more characteristics associated with a feature include(s) an upstream lineage and/or a downstream lineage of the feature. In some embodiments, feature store service 110 provides access to the one or more features and corresponding information to a user such as via a user interface. A user accesses feature store service 110 in connection with storing a feature (e.g., for re-use at a later time or by another developer, etc.), updating or changing a feature, searching for a feature, selecting a feature to use in a training or deploying a model, and/or setting permissions (e.g., access permissions) for the feature. Various other functions can be performed with respect to a feature stored at feature store service 110. As an example, the user accesses feature store service 110 via administrator system 140 or client system 150. According to various embodiments, feature store service 110 automatically updates the information pertaining to a feature in response to a determination that the feature is updated, changed, and/or used by a model or service (e.g., a service that deploys or executes the model).

According to various embodiments, feature store service 110 comprises database layer 112, feature catalog 114, and/or business application layer 116. Feature store service 110 uses database layer 112 to store one or more features and information pertaining to the one or more features. For example, database layer 112 stores a mapping of features to information pertaining to one or more characteristics of features. Database layer 112 services queries received in connection with a user analyzing, or searching for, a feature stored in feature store service 110 (e.g., stored in database layer 112). Feature store service 110 uses feature catalog 114 as a control plane for a feature stored in database layer 112 and the information pertaining to the feature, such as metadata for the feature.

According to various embodiments, feature catalog 114 provides a user interface via which a user discovers and/or accesses one or more features stored in database layer 112, and to use a feature stored in the database layer 112 such as by including a link or reference to the feature in a model and/or a service in which a model is deployed. As an example, the web interface is provided as a web service such as on a page accessed by a user via client system 150. The feature catalog 114 can service a query by user in connection with searching for a feature among the one or more features stored in database layer 112 such as for a feature that matches one or more parameters (e.g., a feature having certain characteristics matching the one or more parameters). In some embodiments, feature catalog 114 mediates access to a feature stored in database layer 112. For example, feature catalog 114 enforces one or more security policies with respect to a feature. An example of one or more security policies include(s) access permissions to a feature such as a permission to upload a feature, a permission to modify a feature, a permission to view a feature, and/or a permission to use or link to a feature. The one or more security policies with respect to a feature can be set by an administrator or other user associated with the feature (e.g., a developer of the feature). As an example, feature catalog 114 queries a security layer (not shown) to authenticate a user accessing feature store service 110, determine permissions for the user, and/or determine whether the user has requisite permissions to perform a particular query or command. In some embodiments, feature catalog 114 monitors changes to a feature stored in database layer 112, accesses to the feature, and/or a use of, or link to, a feature (e.g., an association or link being made between a model and a feature). For example, in response to a determination that the feature is accessed or used (e.g., used as an input to a model), feature catalog 114 logs such access or use in association with the feature (e.g., as metadata for the feature such as a characteristic of the feature).

According to various embodiments, business application layer 116 provides an interface via which a user (e.g., using client system 150) may interact with various applications such as a development application for developing a feature, a development application for developing a model, an application to access raw data (e.g., data stored in data store 130), an application to update a feature (e.g., to automatically update the feature such as by ingesting updated source data), an application to provide (e.g., a batch providing or a real-time providing) a feature to models or endpoints (e.g., services) that use the feature, etc. Various other applications can be provided by business application layer 116. For example, a user queries database layer 112 by sending a query/request to business application layer 116, which interfaces with database layer 112 to obtain information responsive to the query (e.g., feature store service 110 formats the query according to the applicable syntax and sends the formatted query to database layer 112). As another example, an administrator uses an interface provided/configured by business application layer 116 to configure (e.g., define) one or more security policies including access permissions to a feature. In some embodiments, a feature table is sitting in data store 130 and a feature store service provides the location for business application layer 116 to fetch the features directly from data store 130.

According to various embodiments, data store 130 stores raw data such as source data that is used to determine a feature. For example, the raw data is used in connection with computing the feature. In some embodiments, the raw data comprises one or more datasets. Examples of raw data used in connection with an e-commerce implementation is a users' table comprising information pertaining to one or more users (e.g., zip code, payment methods, etc.), items table comprises information pertaining to one or more items (e.g., item description, item category, etc.), a purchases table pertaining to one or more purchases (e.g., a user identifier, an item identifier, a date of the purchase, a quantity of items purchased, a price, etc.). In some embodiments, feature store service 110 communicates with (e.g., accesses) data store 130 to obtain the raw data in connection with computing or updating a feature stored in database layer 112. For example, feature store service 110 transforms raw data stored in data store 130 to features. In some embodiments, feature store service 110 accesses the raw data according to a predefined update frequency (e.g., an updated frequency corresponding to a preset latency). As an example, a feature is updated according to a batch update (e.g., after a predetermined time, at a predetermined frequency, on a regular interval so as to maintain a freshness criteria, or after one or more criteria for a batch update being satisfied, etc.). As another example, a feature is updated in real-time (or near real-time). According to various embodiments, model store service 120 stores one or more models. A model stored in model store service 120 can be associated with one or more features stored at feature store service 110. For example, a model is trained using a feature stored in feature store service 110, and the model is used in connection with deployment of the model such as to a service (e.g., a web service). In some embodiments, model store service 120 stores associations between model store service 120 and a feature used to train and/or deploy the model (e.g., a feature stored at feature store service 110). As an example, model store service 120 stores such associations between models and features as metadata for the models. As another example, model store service 120 stores a location at which the feature associated with the model is accessed (e.g., a uniform resource locator (URL) for the feature at feature store service 110). In some embodiments, the association or link between a feature and a model is configured (e.g., defined) during development of the model.

According to various embodiments, system 100 comprises an administrator system 140 for use by an administrator such as an administrator of feature store service 110. For example, administrator system 140 comprises a system for communication, data access, computation, etc. An administrator uses administrator system 140 to maintain data store 130 (e.g. maintain raw data stored in data store 130), to define and manage features and access to features at feature store service 110, and/or models stored at model store service 120. For example, an administrator uses administrator system 140 to upload or define a feature at feature store service 110, to define one or more security policies that are to be enforced with respect to a feature stored at feature store service 110, etc. Administrator system 140 communicates with feature store service 110 via a web-interface. For example, administrator system 140 communicates with feature store service 110 via a web-browser installed on administrator system 140. As an example, administrator system 140 communicates with feature store service 110 via an application running on administrator system 140.

According to various embodiments, system 100 comprises client system 150. Client system 150 is used by a user (e.g., a developer such as a developer of a feature, a developer of a model, etc.) to communicate with feature store service 110, model store service 120, and/or data store 130. As an example, client system 150 communicates with feature store service 110 via a web-interface. In some embodiments, a user uses client system 150 to develop a feature at feature store service 110, to modify a feature at feature store service 110, to update a feature at feature store service 110, to query database layer 112 (e.g., in connection with discovering a feature to use to train or execute a model), etc.

In some embodiments, database layer 112, feature catalog 114, and/or business application layer 116 are implemented on a single server or a plurality of servers. For example, feature catalog 114 and database layer 112 are different modules running on the same server or set of servers. In some embodiments, feature store service 110, model store service 120, and/or data store 130 are implemented on a single server or a plurality of servers.

Figure 2:
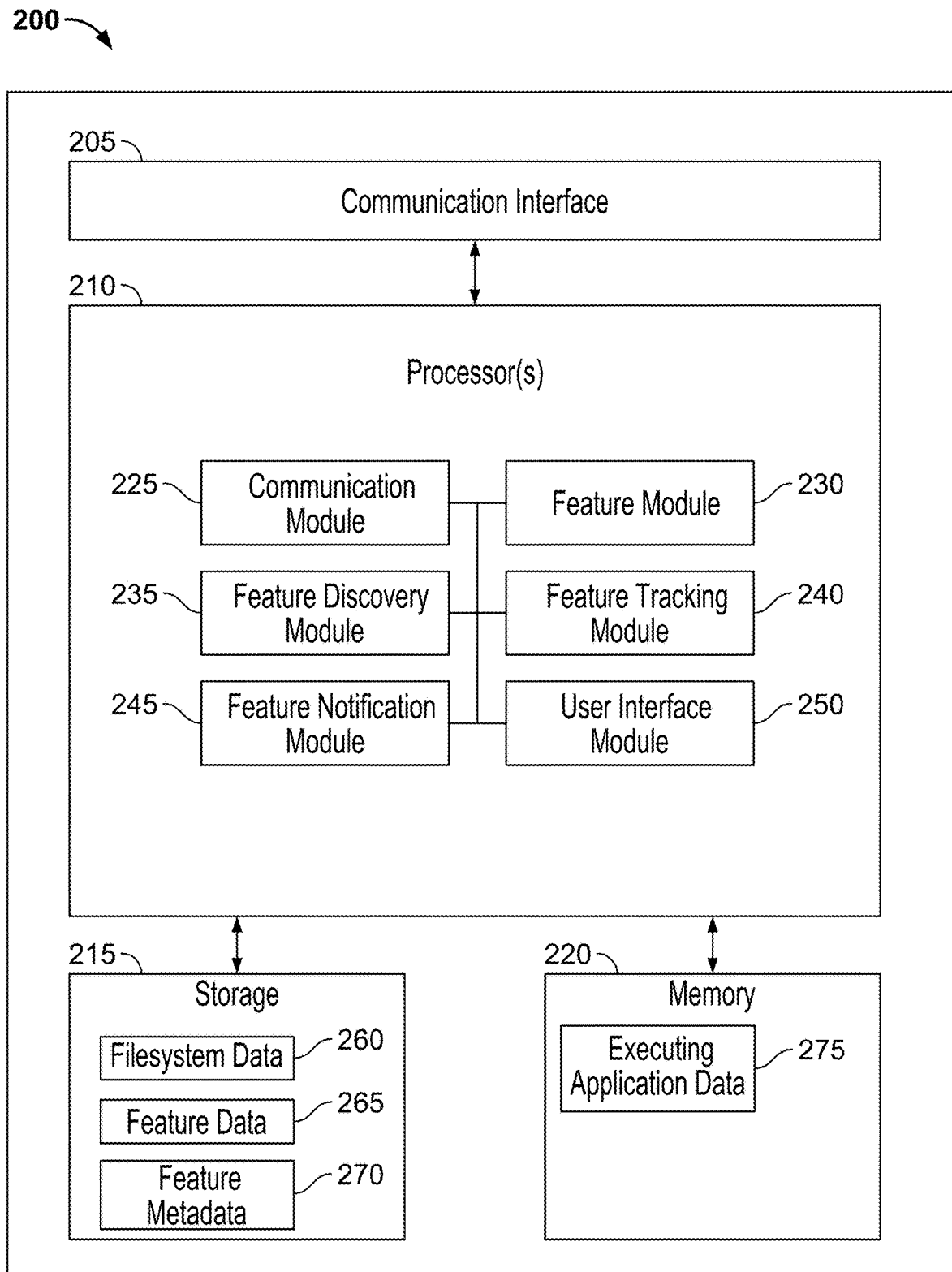
FIG. 2 is a block diagram of a feature store service system according to various embodiments of the present application.

FIG. 2 is a block diagram of a feature store service system according to various embodiments of the present application. In some embodiments, system 200 comprises or corresponds to feature store service 110. In some embodiments, system 200 further comprises one or more of database layer 112, feature catalog 114, and/or business application layer 116. System 200 may implement at least part of system 300 of FIG. 3, process 400 of FIG. 4A, process 450 of FIG. 4B, feature store 475 of FIG. 4C, feature store 500 of FIG. 5A, feature store 550 of FIG. 5B, interface 600 of FIG. 6A, interface 650 of FIG. 6B, process 700 of FIG. 7, and/or process 800 of FIG. 8.

In the example shown, system 200 implements one or more modules in connection with managing one or more features, providing access to the one or more features, and/or tracking (e.g., monitoring) use of the one or more features. System 200 comprises communication interface 205, one or more processors 210, storage 215, and/or memory 220. One or more processors 210 comprises one or more of communication module 225, feature module 230, feature discovery module 235, feature tracking module 240, feature notification module 245, and/or user interface module 250.

In some embodiments, system 200 comprises communication module 225. System 200 uses communication module 225 to communicate with various other systems such as a model store, a data store, and/or client terminals or user systems such as a client system or an administrator system. For example, communication module 225 provides to communication interface 205 information that is to be communicated. As another example, communication interface 205 provides to communication module 225 information received by system 200. Communication module 225 is configured to receive one or more queries or requests to execute tasks such as from various client terminals or user systems, a feature to store in data storage, an update to (or instruction to update) a feature, a request to access a feature (e.g., a request to link or use the feature to train or execute a model, etc.), a request to set one or more security policies (e.g., a permission with respect to accessing a feature). The one or more queries or requests to execute tasks is with respect to information stored in one or more datasets such as features, information pertaining to one or more characteristics of features, and/or a mapping between the features and the information pertaining to one or more characteristics of features. Communication module 225 is configured to provide to various client terminals or user systems information such as information that is responsive to one or more queries or tasks requested to be executed. In some embodiments, communication module 225 provides the information to the various client terminals or user systems information in the form of one or more reports (e.g., according to a predefined format or to a requested format), and/or via one or more users interfaces (e.g., an interface that client system 150 is caused to display). In some embodiments, communication module 225 is configured to receive information and/or an instruction pertaining to a feature such as from various client terminals or user systems. For example, communication module 225 is configured to receive a new feature or an updated feature from a user such as via administrator system 140. As another example, communication module 225 is configured to receive a configuration of a feature stored by system 200 such as in database layer 112 of feature store service 110. In some embodiments, communication module 225 is configured to receive information and/or an instruction pertaining to an application deployed with respect to a feature (e.g., updating or refreshing features, enforcing security policies, etc.) such as from various client terminals or user systems. As another example, communication module 225 is configured to receive a configuration of a feature stored by the system 200 such as in database layer 112. In some embodiments, communication module 225 is configured to receive information and/or an instruction pertaining to configurations (e.g., settings) pertaining to features, use of, or links to, features by models and/or endpoints, etc.

In some embodiments, system 200 comprises feature module 230. System 200 uses feature module 230 to store and manage features in feature module 230. Feature module 230 is configured to receive an instruction or request with respect to a feature stored by system 200. For example, feature module 230 receives a security policy with respect to the feature, an instruction to update or refresh the feature, an update to the feature, a modification to the feature, an instruction to delete the feature, etc. As another example, feature module 230 receives a request to discover a feature (e.g., a request comprising one or more parameters in connection with searching the feature store), a request to use the feature (e.g., to reference or link the feature in connection with training, executing, or otherwise deploying a model), etc. Feature module 230 is configured to monitor a status of a feature in the feature store (e.g., a date of last refreshing or updating), store information pertaining to the feature such as one or more characteristics of the feature, to monitor uses or references of a feature such as a downstream lineage of the feature (e.g., an identification of a model that relies on the feature such as a model that is trained with the feature or that uses the feature in connection with execution of the model), to store information pertaining to a lineage of the feature (e.g., an indication of a model that relies on the feature, an indication of an endpoint or how the feature is used by endpoints such as applications for models that rely on the feature, etc.), etc. In some embodiments, feature module 230 receives a feature or a modification to a feature, and stores the feature or modification to a feature such as in storage 215. In some embodiments, feature module 230 determines an estimated time at which feature is to be updated (e.g., feature module 230 determines that source data is stale, that downstream use or adoption is decreased, that different downstream uses correspond to contexts for which a relatively low latency is required, etc.).

In some embodiments, system 200 comprises feature discovery module 235. System 200 uses feature discovery module 235 to execute one or more queries with respect to features stored in the feature store. As an example, feature discovery module 235 receives a query from a user (e.g., via communication module 225 or feature module 230) in connection with the user performing a search for a feature matching one or more parameters. In response to receiving the query, feature discovery module 235 performs a search with respect to features stored in the feature store (e.g., features stored in storage 215). Feature discovery module 235 provides a set of results to a query (e.g., a set of features responsive to the query) to the user such as via user interface module 250 and/or communication module 225.

In some embodiments, system 200 comprises feature tracking module 240. System 200 uses feature tracking module 240 to maintain an upstream lineage and a downstream lineage of a feature stored in the feature store. Feature tracking module 240 stores information pertaining to source data such as one or more datasets that is an input to a feature (e.g., raw data used to determine/compute the feature). In some embodiments, feature tracking module 240 stores other information that is an input to the feature such as code (or an indication of a code) used in development of the feature, etc. Feature tracking module 240 monitors for changes in the source data used with respect to a feature (e.g., as a feature is modified to use a different dataset, feature tracking module 240 determines that such a modification). In response to detecting that a change occurs with respect to the source data associated with (e.g. used as an input to) a feature, feature tracking module 240 updates metadata pertaining to an upstream lineage of the feature. Feature tracking module 240 monitors for changes in downstream applications of a feature. For example, feature tracking module 240 monitors for use of the feature such as by a model or endpoint (e.g., information pertaining to a source of a model, use of a model, etc.). As another example, feature tracking module 240 monitors for use of the feature store. Feature tracking module 240 stores information received in connection with monitoring changes to the upstream lineage and/or downstream lineage of a feature. For example, the information pertaining to changes to the upstream lineage and/or downstream lineage of a feature is stored as metadata for the feature (e.g., in feature metadata 270 of storage 215). In some embodiments, a model or model store that manages the model comprises information pertaining to the manner by which the model is used downstream (e.g., an application or web service in which the model is deployed, etc.) and feature tracking module 240 receives the information pertaining to the manner by which the model is used downstream. Feature tracking module 240 uses an association between the model and one or more features in connection with storing in association with the one or more features the information pertaining to the manner by which the model is used downstream.

In some embodiments, system 200 comprises feature notification module 245. System 200 uses feature notification module 245 to provide notifications with respect to a feature stored in the feature store. Feature notification module 245 generates a notification and provides a notification to a user via communication module 225 and/or user interface module 250. Examples of a notification include: (a) a notice that a new feature is available in feature store and the new feature matches parameters of a previous search of feature store, (b) a notice that a feature on which a model relies (e.g., for training or execution, etc.) is updated, modified, or deleted (or scheduled to be updated, modified, or deleted) or that a characteristic of the feature has changed (e.g., a data type of the feature, a size of the feature, or a quality metrics like nullness, completeness, and value distributions of the feature over time), (c) a notice that a source data for a feature on which a model relies has changed or is no longer available, (d) a notice that a downstream lineage for a feature has changed (e.g., a notice that a new downstream use has been determined), (e) a notice that a metric pertaining to adoption of a feature has changed (e.g., a new comment with respect to the feature, a new rating of the feature, (f) a notice that a code used in development of the feature has changed, (g) a notice of a change in latency of source data associated with a feature (e.g., a notice of whether a time period within which the source data is updated has changed), etc. Feature notification module 245 provides a notification to a user such as a developer of a feature, a developer of a model that uses the feature store to discover or obtain/use models, an administrator, etc.

In some embodiments, system 200 comprises feature notification module 245. System 200 uses user interface module 250 to in connection with configuring information (or the display thereof) to be provided to the user such as via a client system or an administrator system. In some embodiments, user interface module 250 is implemented by feature store service 110 of system 100 of FIG. 1, such as by feature catalog 114 and/or business application layer 116. In some embodiments, user interface module 250 configures a user interface to be displayed at a client terminal used by the user or administrator, such as an interface that is provided in a web browser at the client terminal. In some embodiments, user interface module 250 configures the information to be provided to the user such as configuring one or more reports of information that is responsive to a query or task executed with respect to database layer 112 (e.g., a query or task executed against one or more datasets). In some embodiments, user interface module 250 configures one or more user interfaces via which a user controls or manages features (e.g., updating of features, creation of new features, etc.), develops models or downstream application (e.g., creates a link or reference to a feature stored in feature store, etc.), configures a security policy such as access permissions to a particular feature, etc.

According to various embodiments, storage 215 comprises one or more of filesystem data 260, feature data 265, and/or feature metadata 270. Storage 215 comprises a shared storage (e.g., a network storage system) and/or database data, and/or user activity data. In some embodiments, filesystem data 260 comprises a database such as one or more datasets (e.g., one or more datasets for one or more features, etc.). Filesystem data 260 comprises data such as a code used in connection with development of a feature, data generated in connection with managing features in the feature store, etc. In some embodiments, feature data 265 comprises information pertaining to one or more features (e.g., features available in the feature store). For example, feature data 265 comprises one or more features uploaded or developed in the feature store. In some embodiments, feature metadata 270 comprises information pertaining to one or more features stored in the feature store. The information pertaining to the feature comprises information indicating a status of a feature, an upstream lineage of a feature, a downstream lineage of a feature, a development history of the feature, an access history of the feature, a version history of the feature, etc. The feature metadata 270 comprises the one or more characteristics of a feature.

According to various embodiments, memory 220 comprises executing application data 275. Executing application data 275 comprises data obtained or used in connection with executing an application such as an application executing in connection with providing the feature store, to manage and store features in the feature store, to expose features to users such as to provide an interface via which the features are accessible to users and/or models, etc. In embodiments, the application comprises one or more applications that perform one or more of receiving and/or executing a query or task, generating a report and/or configure information that is responsive to an executed query or task, and/or providing to a user information that is responsive to a query or task. Other applications comprise any other appropriate applications (e.g., an index maintenance application, a communications application, a chat application, a web browser application, a document preparation application, a report preparation application, a user interface application, a data analysis application, an anomaly detection application, a user authentication application, a security policy enforcement application, a feature rating application, a feature analysis application, a feature development application, etc.).

Figure 3:
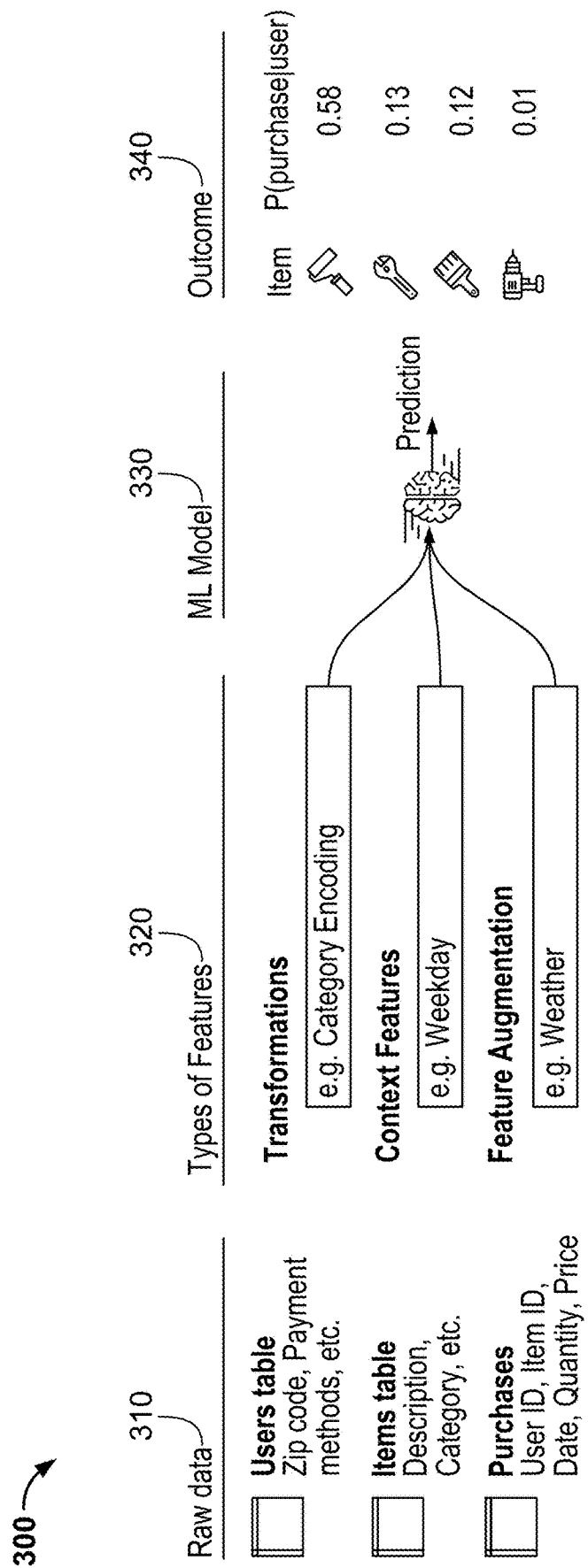
FIG. 3 is a diagram of an example of a relationship among data, features, models, and outcomes according to various embodiments of the present application.

FIG. 3 is a diagram of an example of a relationship among data, features, models, and outcomes according to various embodiments of the present application. According to various embodiments, system 300 is implemented at least in part by system 100 of FIG. 1 and/or system 200 of FIG. 2.

In the example shown, system 300 comprises raw data 310, features 320, models 330, and outcomes 340. The relationships among raw data 310, features 320, models 330, and outcomes 340 are illustrated.

Raw data 310 comprises one or more datasets. The one or more datasets can comprise different information such as information pertaining to different contexts, different types of information, different time periods, etc. As an example, a dataset can correspond to current information (e.g., a dataset that is contemporaneously updated or in real time), past information (e.g., a dataset comprising information that was obtained at a threshold period of time before the current time), etc. According to various embodiments, raw data 310 is used as source data (e.g., as an input) to one or more features. As an example, raw data 310 is stored in data store 130 of system 100 of FIG. 1.

Features 320 comprise one or more types of features. Features 320 corresponds to the one or more features stored in a feature store and exposed to one or more users such as developers of features or models, and to one or more models such as models that are trained or executed using a feature. In some embodiments, a feature comprised in feature 320 is determined (e.g., computed) using one or more datasets comprised in raw data 310. For example, the feature comprises relationships among one or more datasets or among information comprised in a dataset.

Models 330 comprise one or more models. The one or more models can correspond to machine learning (ML) models that are trained using information and/or features. As an example, models 330 are stored in model store service 120 of system 100 of FIG. 1. According to various embodiments, a model in models 330 relies on one or more features of features 320. As illustrated the model uses three features in connection with generating a prediction or outcome. A model is trained using one or more features, and the model can further use the one or more features in connection with executing the model (e.g., using the model to generate a prediction). For example, use of the feature to train or in connection with execution of a model is monitored and logged at the feature store in association with the feature.

Outcomes 340 comprises one or more outcomes that are determined (e.g., generated) using a model of models 330. According to various embodiments, an outcome includes an estimate, a projection, a prediction, a recommendation (e.g., in the case of an e-commerce store, a recommendation can be a recommended item to display to a user), a likelihood or probability (e.g., a probability that a purchaser will click through an advertisement or purchase a recommended item, a probability that a transaction is fraudulent, a probability that a transaction is genuine), etc. In some embodiments, an indication of the outcome or the type of outcome is stored in association with the feature in the feature store. For example, an indication of the outcome includes a context in which the outcome is used, and the context or application to which the model is deployed is stored in association with a downstream lineage of the one or more features relied on by the model to generate the outcome.

Figure 4A:
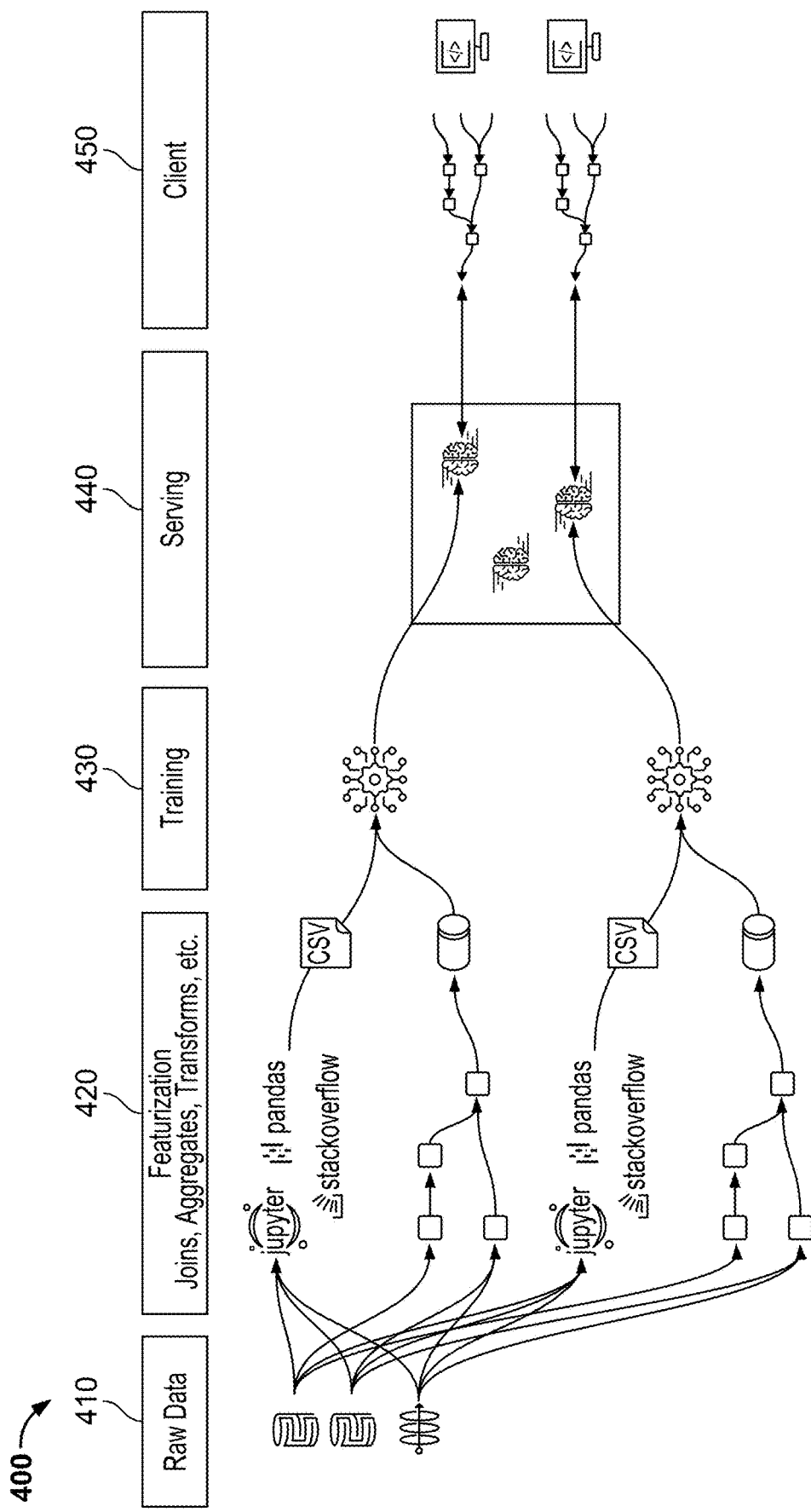
FIG. 4A is a diagram of a method for using a feature according to various embodiments of the present application.

FIG. 4A is a diagram of a method for using a feature according to various embodiments of the present application. According to various embodiments, process 400 is implemented at least in part by system 100 of FIG. 1 and/or system 200 of FIG. 2.

At 410, raw data is stored. In some embodiments, the raw data comprises one or more raw data. As an example, the raw data is stored in one or more databases such as data store 130. In some embodiments, the one or more databases are provided by one or more servers that are co-located with a feature store. In some embodiments, the one or more databases are remote from the feature store such as a database provided by a third party service. The raw data is exposed to a feature store or otherwise to one or more features.

At 420, a feature is determined. According to various embodiments, determining (or computing) the feature comprises one or more of: joining data among one or more datasets of raw data, aggregating data obtained from the raw data, transforming data comprised in the raw data, determining a relationship among data obtained from the raw data, etc. In some embodiments, in response to determining the feature, the feature is stored in the feature store such as in database layer 112 of feature store service 110 of FIG. 1. As an example, in connection with storing the feature in the feature store, information indicating the raw data (e.g., the one or more datasets) used in the determining the feature is stored in the feature store in association with the feature (e.g., mapped to the feature such as metadata for the feature).

Figure 4B:
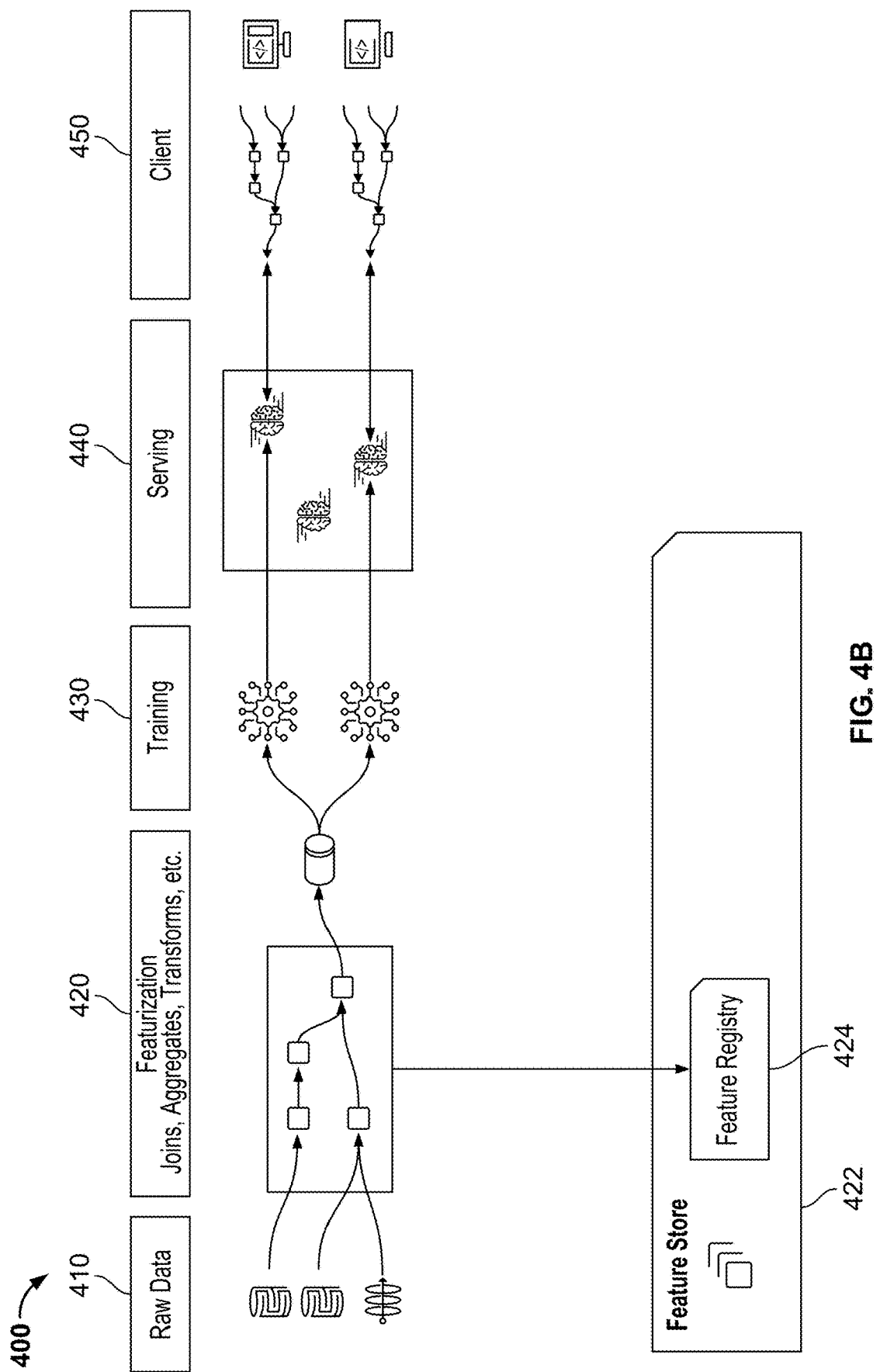
FIG. 4B is a diagram of an example of a lifecycle of a feature according to various embodiments of the present application.

FIG. 4B is a diagram of an example of a lifecycle of a feature according to various embodiments of the present application. As illustrated in FIG. 4B, the feature(s) are stored in feature store 422. For example, the feature is stored in a feature registry 424 of feature store 422. According to various embodiments, feature registry corresponds to one or more of database layer 112, feature catalog 114, and/or business application layer 116 of feature store service 110 of FIG. 1.

According to various embodiments, the feature is exposed via the feature store 422. For example, the feature is searchable and accessible by a user such as in connection with development of a model. The user selects (e.g., via the feature store) a feature to use with respect to a model (e.g., a feature to use as an input to the model for training the model and/or for execution of the model).

Returning to FIG. 4A, at 430, one or more models are determined. The one or more models can be stored at a model store such as model store service 120 of system 100 of FIG. 1. In some embodiments, the training the one or more models comprises training the one or more models using one or more features. As an example, a model is trained using one or more features stored in the feature store. For example, in connection with training or executing the model (e.g., determining an outcome using the model), the model (or module running the model) sends a call to the feature store to access or otherwise obtain one or more features. In response to receiving the call and/or providing the feature to the model, the feature store logs such use of the feature in association with a downstream lineage of the model.

Figure 4C:
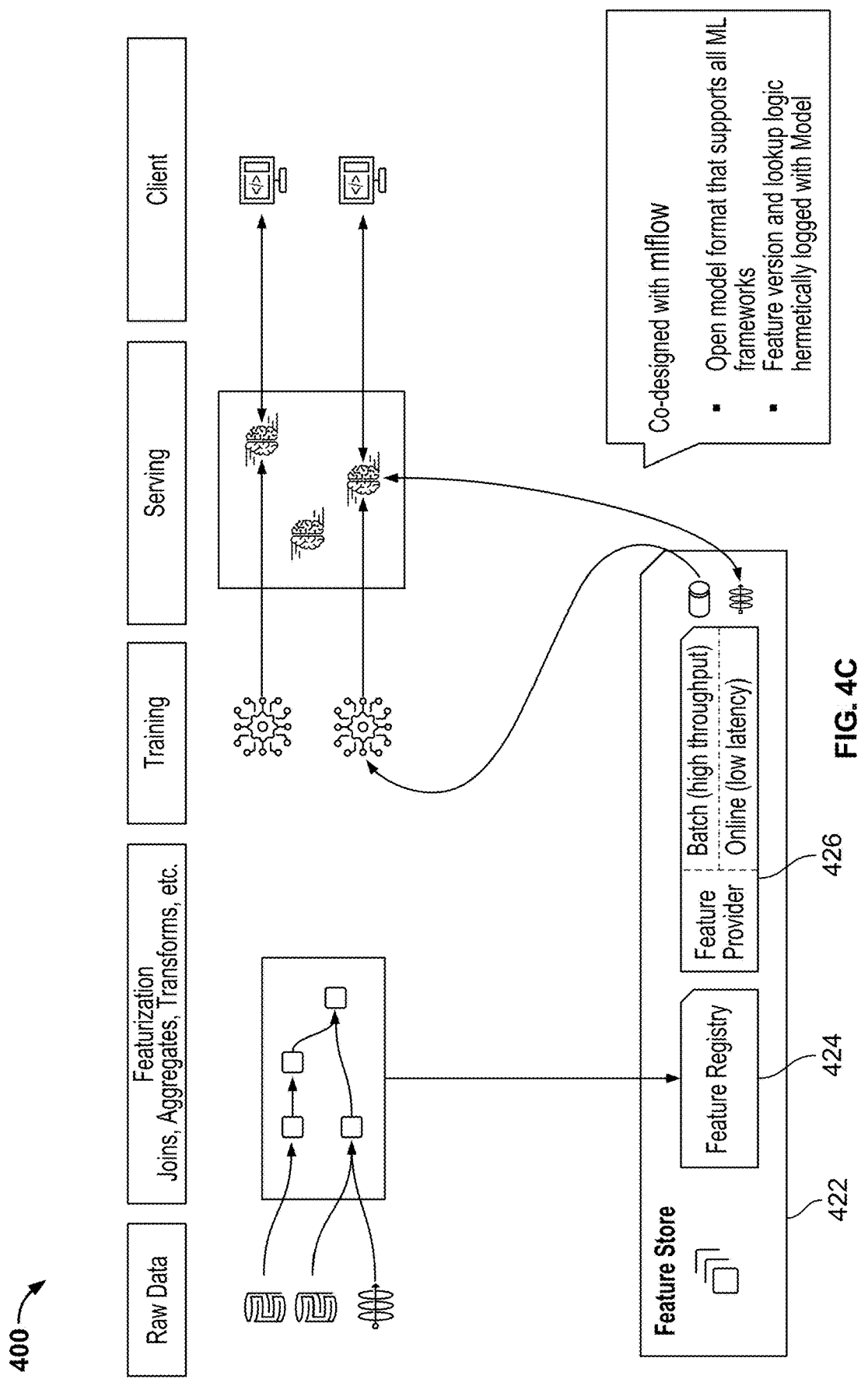
FIG. 4C is a diagram of an example of a feature store according to various embodiments of the present application.

FIG. 4C is a diagram of an example of a feature store according to various embodiments of the present application. As illustrated in FIG. 4C, the model accesses the feature via feature provider 426 in connection with training the model.

In some embodiments, feature provider 426 comprises a batch module for providing access to features for high-throughput applications. The batch module provides access to a feature for offline applications such as training a model or for executing a batch inference. In some embodiments, feature provider 426 comprises an online module for providing access to features for real-time or low latency applications. The online module provides access to a feature such as in connection with deploying a model in a service that provides real-time recommendations (e.g., an e-commerce platform that provides recommendations for a user currently browsing a website, a transaction processing service that assesses whether a transaction is fraudulent contemporaneous with the transaction such as a credit card processing, etc.).

At 440 of FIG. 4A, one or more models are deployed (e.g., served). In some embodiments, deploying a model includes using the model in association with (e.g., for) an endpoint such as a service (e.g., web service) or other application. According to various embodiments, the deploying the model comprises using the model to generate an outcome. As an example, when the model is called to provide an outcome for the service, the model sends a call to the feature (e.g., to the feature store) to use the feature in connection with generating the outcome. Information pertaining to the feature is stored in association with the model. For example, an identifier of the feature and/or an indication of a version of the feature is stored in association with the model to ensure that when executing the model to provide a service, there is no information drift (e.g., an inconsistency arising from a change in a feature, method, or code and libraries used in feature computation, or data sources used to compute the feature used to train the model and a feature used to execute the model).

At 450, a service is provided to a user or client. In some embodiments, a service is provided to a client terminal associated with a user. The service comprises, or is based at least in part on, an outcome generated based at least in part on the deployment of the one or more models. For example, the outcome comprises a recommendation based at least in part on an analysis of a set of information and the use of one or more features used in executing the model. An example of a service provided to a user comprises providing a recommendation of an item to purchase on an e-commerce platform. The e-commerce platform obtains information pertaining to the user and/or a context associated with the user, provides such information to the model, and the model uses one or more features and such information to provide a recommendation for the service to provide to the user. In the example illustrated in FIG. 4C, in connection with providing the service to the client terminal of the user, the feature is obtained (e.g., automatically based on metadata, lineage, and code packaged in the model) from/using the online module of feature provider 426 (e.g., to provide a contemporaneous or real-time outcome for the service). In some embodiments, the selection of provider is critical (e.g., for batch prediction, use batch provider from a batch storage layer for high throughput; for low latency, one or more online stores or real time model scoring; for selecting among a plurality of online store options, selecting a most relevant online store based on a relevance criteria, etc.).

Figure 5A:
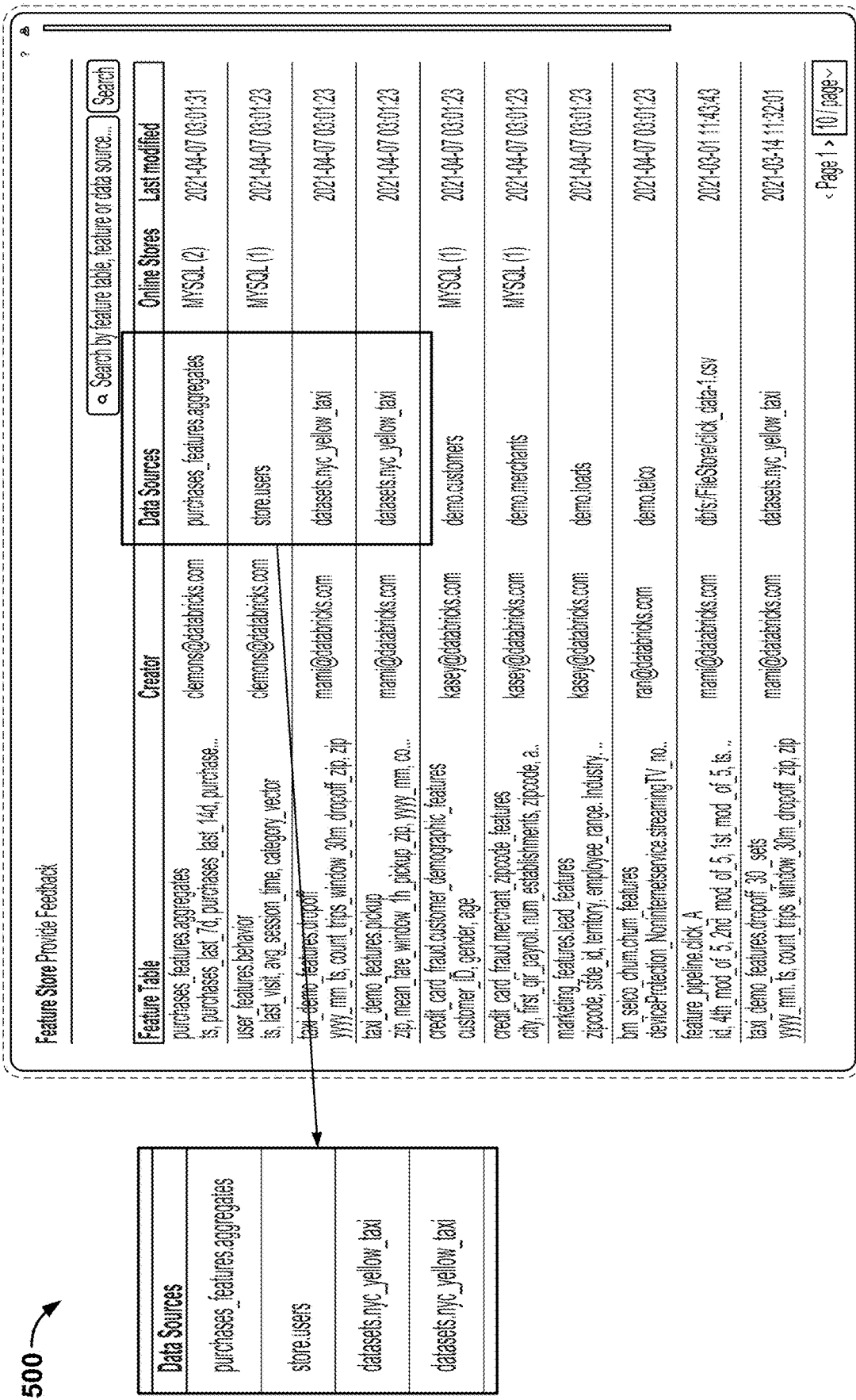
FIG. 5A is a diagram of an example of a feature store according to various embodiments of the present application.

FIG. 5A is a diagram of an example of a feature store according to various embodiments of the present application. According to various embodiments, feature store 500 is implemented at least in part by system 100 of FIG. 1, and/or system 200 of FIG. 2. In the example illustrated, feature store 500 comprises a mapping of features to information pertaining to the features. For example, in association with a feature, feature store 500 stores information indicating a creator (e.g., developer, owner, etc.) of the feature, source data (e.g., one or more datasets used to determine the feature), a location at which the feature is stored (e.g., a corresponding online store), and a date and/or time at which the feature was last modified or updated. Feature store 500 can comprise various other types of information pertaining to a feature.

FIG. 5B is a diagram of an example of a feature store according to various embodiments of the present application. According to various embodiments, feature store 550 is implemented at least in part by system 100 of FIG. 1, and/or system 200 of FIG. 2. In the example illustrated, feature store 550 comprises information associated with a model. For example, feature store 550 comprises one or more characteristics of a feature (e.g., metadata associated with a feature). For example, feature store 550 stores information indicating a name or identifier of the feature, a data type corresponding to the feature, an identifier of one or more models that use the feature, and an identifier of one or more endpoints that use the feature (or for which the feature is deployed). Feature store 500 can comprise various other types of information pertaining to a feature.

FIG. 6A is a diagram of a user interface of a feature store according to various embodiments of the present application. FIG. 6B is a diagram of a user interface of a feature store according to various embodiments of the present application. According to various embodiments, interface 600 and interface 650 are implemented at least in part by system 100 of FIG. 1, and/or system 200 of FIG. 2. In some embodiments, interface 600 and interface 650 are implemented in connection with process 700 of FIG. 7, and/or process 800 of FIG. 8. As an example, interface 600 and interface 650 are a user interface that is displayed by a terminal such as administrator system 140 or client system 150 of system 100 of FIG. 1.

In the example illustrated, interface 600 exposes a feature to a user. In connection with exposing the feature to the user, feature store provides on interface 600 various information pertaining to the feature. For example, interface comprises one or more of an identifier or name 602 of the feature (e.g., firehose), description 604 of the feature, an indication of one or more owners 606 of the feature (e.g., a user that created the feature and/or that has permission to modify or delete the feature), an indication of frequent users 608 of the feature, an indication of one or more policies 610 associated with the feature, an indication of a set of most popular or frequent queries 612 associated with the feature (e.g., queries for which the feature is used), a set of statistics 614 associated with the feature (e.g., a format, a date or time of last update, a date or time at which the feature was created, a size of the feature, etc.), information pertaining to schema 616 of the feature, a lineage 618 of the feature (e.g., an upstream lineage and a downstream lineage), an indication of privileges 620 associated with the feature (e.g., an indication of a user or group having privileges, an indication of a set or scope of permissions associated with the privileges, a date on which the privileges were set or are due to expire), information indicating data sample 622. In some embodiments, some information pertaining to the feature is provided as a selectable element (e.g., a hyperlink) that upon selection of the element causes more detailed information pertaining to the subset of information corresponding to the selectable element.

Referring to FIG. 6B, interface 650 provides more detailed information pertaining to the feature such as information corresponding to a schema of a particular feature. Interface 650 includes a set of fields of a feature, a type of data, and corresponding comments.

In some embodiments, the user interface for a feature store comprises a catalog user interface or application.

Figure 7:
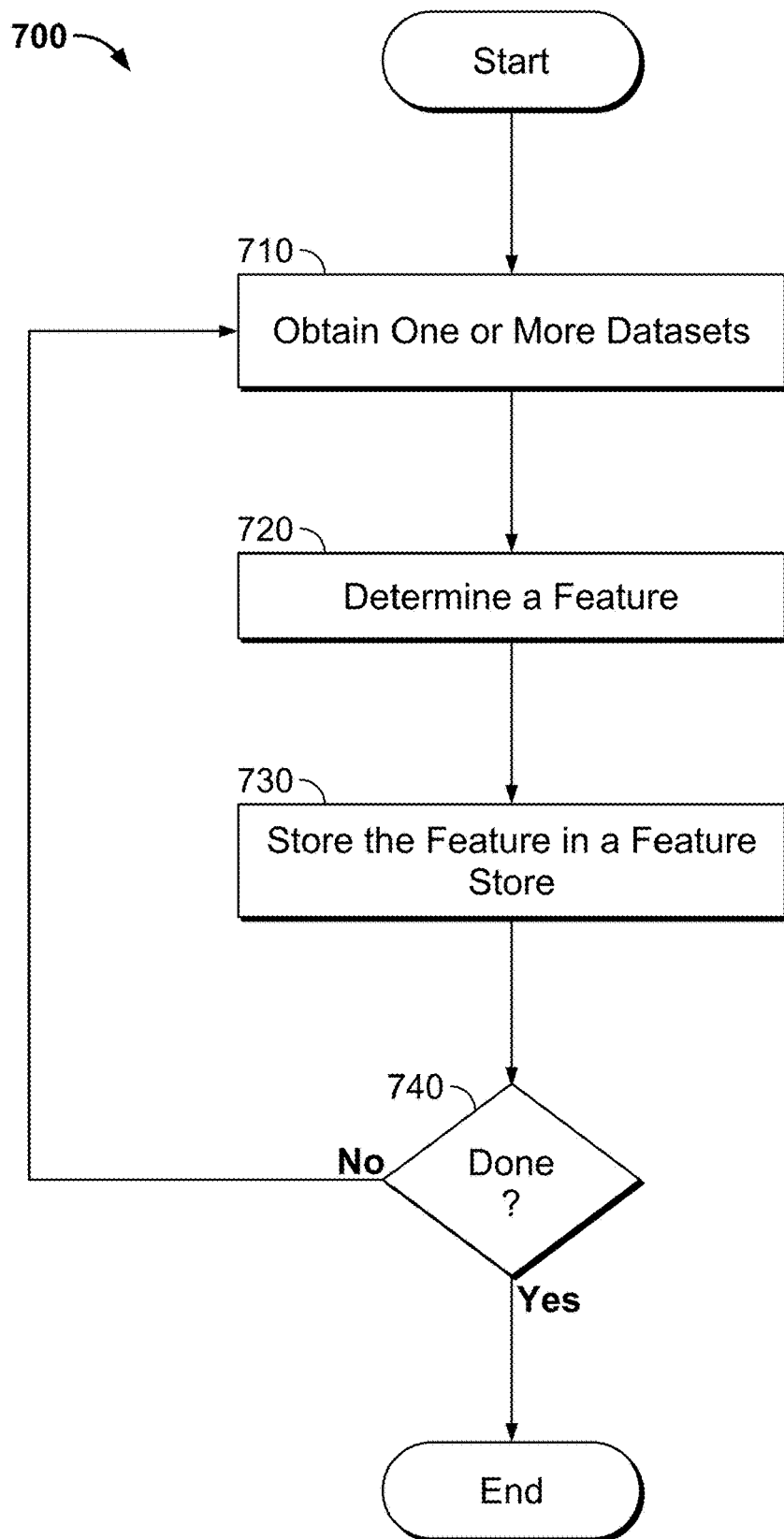
FIG. 7 is a flow diagram of a method for storing a feature according to various embodiments of the present application.

FIG. 7 is a flow diagram of a method for storing a feature according to various embodiments of the present application.

At 710, one or more datasets are obtained. In some embodiments, obtaining the one or more datasets comprises selecting one or more datasets to be used in connection with developing a feature, or otherwise linking/associating the one or more datasets with a feature. As an example, the one or more datasets are stored in a data store (e.g., data store 130 of system 100 of FIG. 1) that is accessible via a feature store.

At 720, a feature is determined. In some embodiments, determining the feature comprises obtaining the feature. According to various embodiments, determining (or computing) the feature comprises one or more of joining data among the one or more datasets of raw data, aggregating data obtained from the raw data, transforming data comprised in the raw data, determining a relationship among data obtained from the raw data, etc. The one or more datasets correspond to source data for the feature.

At 730, the feature is stored in a feature store. In some embodiments, the feature is stored in a database layer of the feature store (e.g., database layer 112 of feature store service 110). The feature is stored in the feature store in association with information pertaining to the feature (e.g., metadata associated with the feature). As an example, the information pertaining to the feature includes lineage information such as upstream lineage information or downstream lineage information. Upstream lineage information includes an indication of source data for the feature. Downstream lineage information includes an indication of which feature(s) and/or model(s) consume the feature. As another example, the information pertaining to the feature includes code used in the development of the feature. Upon the feature being stored in the feature store, the feature store exposes the feature to other users such as users with requisite permissions to view and/or access the feature. For example, the feature is accessible via the feature store for re-use by other users such as developers of models, etc. As the feature is adopted, a lineage of the feature is updated. For example, in response to a determination that the feature is adopted (e.g., used downstream such as for training or executing a model, or otherwise in connection with an endpoint), downstream lineage information is stored/updated at the feature store in association with the feature.

According to various embodiments, the feature store comprises a mapping of features to information pertaining to one or more characteristics of features. Examples of the one or more characteristics of features include: (a) a dataset indication of the one or more datasets from which the particular feature is determined (such one or more datasets are also referred to herein as source data); (b) a date and/or time the feature was last modified and/or updated; (c) an update frequency for the feature or some measure of freshness (e.g., where freshness comprises an indication that the feature is computed and updated on a regular interval); (d) an indication of one or more models that use, or that are generated based at least in part on, the particular feature; (e) an indication of one or more endpoints that use a model that uses, or is generated based at least in part on, the particular feature; (f) a ranking of the feature; (g) a rating of the feature; (h) a measure of effectiveness of the particular feature; (i) a measure of accuracy of the particular feature; (j) an indication of at least part of the code used to determine (e.g., compute) the particular feature; (k) a developer or creator of the particular feature; (l) a measure of a popularity of the particular feature; (m) a version identifier; (n) a latency property associated with the particular feature; and (o) a code that uses (or that relies on) the feature. Various other characteristics of features can be stored in association with the corresponding feature in the feature store. In some embodiments, the mapping of a feature to information pertaining to one or more characteristics of the feature is updated based at least in part on an updating of the feature, an update or change of a source data corresponding to the feature, and/or an update to a use of the feature. For example, the feature store is updated to maintain a current upstream lineage of a feature to source data and/or a current downstream lineage of the feature to models or endpoints that use or rely on the feature. As an example, the feature store is automatically updated to maintain the current upstream lineage, current downstream lineage, and/or status of a particular feature.

At 740, a determination is made as to whether process 700 is complete. In some embodiments, process 700 is determined to be complete in response to a determination that no further features are to be determined or stored in feature store, a user has indicated that no further features are to be moved, the user has exited the system, an administrator indicates that process 700 is to be paused or stopped, etc. In response to a determination that process 700 is complete, process 700 ends. In response to a determination that process 700 is not complete, process 700 returns to 710.

Figure 8:
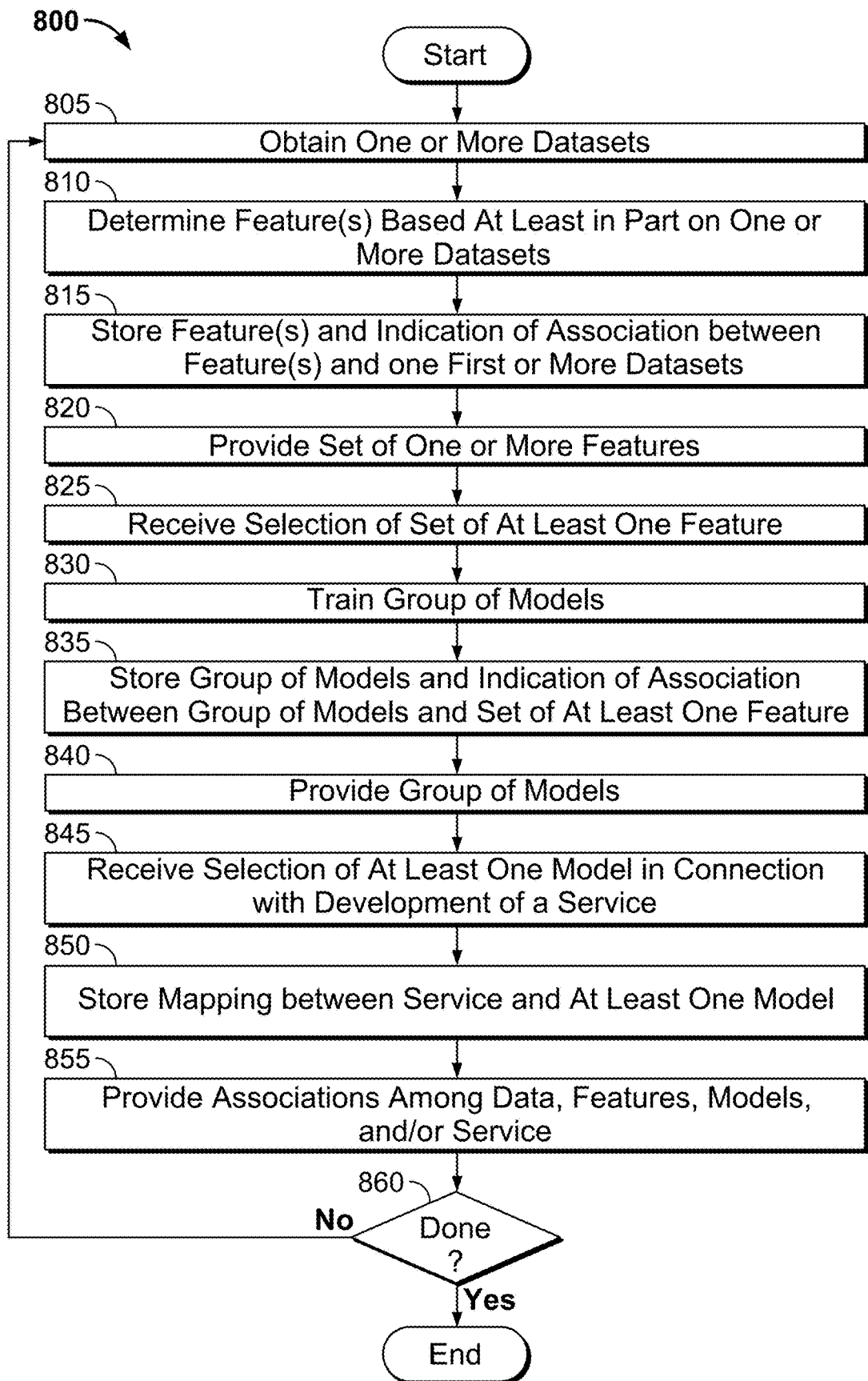
FIG. 8 is a flow diagram of a method for storing information pertaining to a lineage of a feature according to various embodiments of the present application.

FIG. 8 is a flow diagram of a method for storing information pertaining to a lineage of a feature according to various embodiments of the present application.

At 805, one or more datasets are obtained. In some embodiments, obtaining the one or more datasets comprises selecting the one or more datasets or linking/associating the one or more datasets with a feature. In some embodiments, 805 corresponds to, or is similar to, 710 of process 700 of FIG. 7.

At 810, feature(s) is/are determined based at least in part on the one or more datasets. In some embodiments, the determining the feature(s) comprises one or more of joining data among one or more datasets of raw data, aggregating data obtained from the raw data, transforming data comprised in the raw data, determining a relationship among data obtained from the raw data, etc.

At 815, feature(s) and an indication of an association between the feature(s) and the one or more datasets is/are stored. In some embodiments, the feature(s) is/are stored in a database layer of the feature store (e.g., database layer 112 of feature store service 110). The feature(s) is/are stored in the feature store in association with information pertaining to the feature (e.g., metadata associated with the feature). For example, information pertaining to the feature(s) comprise(s) the indication of the association between the feature(s) and the one or more datasets. The indication of the association between the feature(s) and the one or more datasets comprises and indication that the one or more datasets correspond to source data for the feature(s) (e.g., that the source data is an input to the feature(s)).

At 820, a set of one or more features are provided. In some embodiments, the set of one or more features is/are provided to a user interface such as an interface that is provided (e.g., displayed) to a client system. As an example, the providing the set of the one or more features corresponds to, or comprises, exposing the set of one or more features to users such a developers of models, developers of services such as web services, etc. In some embodiments, the interface provided at the client system is provided as a user interface on a web application/web service.

At 825, a selection of a set of at least one feature is received. In some embodiments, receiving the selection of the at least one feature comprises receiving a user input for the set of at least one feature. For example, the user input corresponding to selection of the set of at least one feature corresponds to a selection to user the at least one feature as an input to a model (e.g., a selection to use the set of at least one feature to train and/or execute a model). As an example, the user input is input to a user interface provided at the client system. In some embodiments, in addition to selection at this stage, additional data from a data store (e.g., data store 130) could be automatically joined with the features from a feature store (e.g., feature store 110) for model training.

At 830, a group of models is trained. In some embodiments, the group of models is trained based at least in part on the set of at least one feature. For example, the set of at least one feature is selected in connection with developing the group of models. As an example, a model of the group of models is a machine learning model. According to various embodiments, the use of the set of at least one feature corresponds to a downstream use of the set of at least one feature, and correspondingly is part of the downstream lineage for the set of at least one feature. In some embodiments, the group of models comprises one model, two models, five models, or any other number of models.

At 835, the group of models and indications of an association between the group of models and the set of at least one feature. In some embodiments, each model of the group of models is stored in a model store such as a model store provided by model store service 120 of system 100 of FIG. 1. According to various embodiments, the model store is integrated with, or part of, the feature store (e.g., the feature store in which the first feature is stored). The indication of an association between a given model and the set of at least one feature associated with that given model is stored in at least the feature store such as in association with the set of at least one feature. For example, the information pertaining to the features in the set of at least one feature is updated in the feature store to include the given model as at least part of the downstream lineage for such features. In some embodiments, the indication of an association between the given model and the set of at least one feature is also stored in the model store.

At 840, the group of models are provided. In some embodiments, the group of models are provided to a user interface such as an interface that is provided (e.g., displayed) to a client system. As an example, the providing the set of the one or more features corresponds to, or comprises, exposing the group of models to users such a developers of services such as web services, etc. In some embodiments, the interface provided at the client system is provided as a user interface on a web application/web service.

At 845, a selection of at least one model is received in connection with development of a service. In some embodiments, receiving the selection of the at least one model comprises receiving a user input for the at least one model. For example, the user input corresponding to selection of the at least one model corresponds to a selection to user the at least one model to generate (e.g., determine) an outcome that is to be used as an input to the service (e.g., a web service). As an example, the user input is input to a user interface provided at the client system.

At 850, a mapping between the service and the at least one model is stored. In some embodiments, the mapping is stored in the model store in which the at least one model is stored. According to various embodiments, the model store is integrated with, or part of, the feature store (e.g., the feature store in which the first feature is stored). An indication of the mapping between the service and the at least one model is stored in the feature store such as in association with one or more applicable features. For example, in response to selection of the at least one model to determine an outcome for the service, the feature store updates a downstream lineage for a feature(s) having a downstream lineage comprising the at least one model. The update to the downstream lineage comprises storing the service in the downstream lineage for such feature(s).

At 855, associations among data, features, models, and/or service are provided. In some embodiments, the feature store provides the associations among data, features, models, and/or service are provided. For example, lineage information (e.g., the upstream lineage and/or the downstream lineage) for a feature in the feature store is provided. In some embodiments, the associations among data, features, models, and/or service are provided to a user interface such as an interface that is provided (e.g., displayed) to a client system. As an example, the providing the associations among data, features, models, and/or service corresponds to, or comprises, exposing one or more features and information pertaining to such feature(s) to users such as developers of models, developers of services such as web services, etc. In some embodiments, the interface provided at the client system is provided as a user interface on a web application/web service. In some embodiments, the service is one of a plurality of services each with their associated model(s) and feature(s) that are stored and provided by the system.

At 860, a determination is made as to whether process 800 is complete. In some embodiments, process 700 is determined to be complete in response to a determination that no further features are to be determined or stored in feature store, a user has indicated that no further features are to be moved, the user has exited the system, an administrator indicates that process 800 is to be paused or stopped, etc. In response to a determination that process 800 is complete, process 800 ends. In response to a determination that process 800 is not complete, process 800 returns to 805.

Various examples of embodiments described herein are described in connection with flow diagrams. Although the examples may include certain steps performed in a particular order, according to various embodiments, various steps may be performed in various orders and/or various steps may be combined into a single step or in parallel.

Although the foregoing embodiments have been described in some detail for purposes of clarity of understanding, the invention is not limited to the details provided. There are many alternative ways of implementing the invention. The disclosed embodiments are illustrative and not restrictive.

The invention claimed is:

1. A system, comprising:
one or more processors, and:
one or more memories comprising stored instructions that when executed by the one or more processors cause the system to:
 access one or more datasets stored on a data store;
 determine a feature based at least in part on the one or more datasets;
 store the feature in a feature store, wherein the feature store stores a first set of features and a second set of features;
 store, in the feature store, metadata in association with the feature, the metadata including a mapping from the feature to upstream lineage data indicating the one or more datasets used to determine the feature;
 receive a request to access the first set of features for training a first model, wherein the first set of features includes the feature;
 provide the first set of features to the first model at a first latency;
 determine a model serving endpoint that deploys the first model, wherein the model serving endpoint is a web service;
 store, in the feature store, the metadata in association with the feature, the metadata further including a mapping from the feature to downstream lineage data indicating the first model and the model serving endpoint that deploys the first model;
 receive an update indication that the feature is to be updated;
 determine, responsive to receipt of the update indication and based on the metadata including the mapping from the feature to the downstream lineage data, the model serving endpoint that deploys the first model trained on the feature;
 transmit a notification to the model serving endpoint, the notification indicating that the feature is updated;
 receive a request to access the second set of features for performing inference using a trained second model; and
 provide the second set of features to the trained second model at a second latency, wherein the second latency is lower than the first latency.

2. The system of claim 1, wherein the one or more processors are further configured to:
 train the first model using the first set of features.

3. The system of claim 2, wherein the one or more processors are further configured to:
 store the first model in a model store, wherein:
  the first model is stored in association with data indicating the first set of features used in connection with training the first model; and
  the model store comprises a plurality of models.

4. The system of claim 1, wherein the one or more processors are further configured to:
 determine an additional downstream use of the feature; and
 update the downstream lineage data of the feature with an indication of the additional downstream use.

5. The system of claim 4, wherein the indication of the additional downstream use comprises an indication of a second model serving endpoint that used the feature.

6. The system of claim 1, wherein the feature is stored in association with a dataset indication of the one or more datasets from which the feature is determined, and wherein the dataset indication corresponds to one or more identifiers respectively corresponding to the one or more datasets.

7. The system of claim 1, wherein:
the feature store comprises a code indication of code used to compute the feature; and
the feature store stores the code indication of the code used to compute the feature in association with the feature.

8. The system of claim 7, wherein an association between the feature and the code used to compute the feature is provided to a user.

9. The system of claim 1, wherein:
the feature store stores a plurality of features and one or more indications of one or more downstream uses associated with the plurality of features;
the feature store comprises a plurality of scores for the plurality of features; and
a first score of the plurality of scores is computed based at least in part on the one or more indications of the one or more downstream uses associated with the feature.

10. The system of claim 9, wherein the plurality of features comprised in the feature store are searchable based at least in part on one or more characteristics associated with the plurality of features.

11. The system of claim 10, wherein the one or more characteristics comprise: (i) a dataset used in connection with determining a particular feature, (ii) a date or a time on which the particular feature was last updated, (iii) a number of model serving endpoints that use or reference the particular feature, (iv) an extent to which the particular feature is accurate, (v) a lineage of the particular feature, (vi) a latency property associated with the particular feature.

12. The system of claim 1, wherein the one or more processors are further configured to:
determine a change to at least one dataset used in connection with determining or updating the feature; and
update the mapping between the feature and the upstream lineage data to reflect the change to the at least one dataset.

13. The system of claim 1, wherein the feature store stores information pertaining to an update to the feature.

14. The system of claim 13, wherein the information pertaining to the update to the feature comprises one or more of an update frequency or measure of freshness, a date or a time of a last update, and a version identifier.

15. The system of claim 1, wherein the one or more processors are further configured to:
provide a search interface to a client terminal,
wherein:
the search interface is configured to receive an input from a user of the search interface, and to provide a list of features comprised in the feature store that satisfy one or more parameters of the input.

16. The system of claim 1, wherein the one or more processors are further configured to:
receive, from a model, a feature request, the feature request comprising information pertaining to data being requested;
determine, from among a plurality of features in the feature store, one or more matching features comprising an input dataset matching the information pertaining to data being requested in the feature request; and
provide, to the model, the one or more matching features or information pertaining to the one or more matching features.

17. The system of claim 1, wherein the one or more processors are further configured to:

send, by the model serving endpoint that deploys the first model: (i) a call to the feature store to access the updated feature, and (ii) a call to the first model to generate an outcome based on the updated feature.

18. A method, comprising:
accessing one or more datasets stored on a data store;
determining a feature based at least in part on the one or more datasets;
storing the feature in a feature store, wherein the feature store stores a first set of features and a second set of features;
storing, in the feature store, metadata in association with the feature, the metadata including a mapping from the feature to upstream lineage data indicating the one or more datasets used to determine the feature;
receiving a request to access the first set of features for training a first model, wherein the first set of features includes the feature;
providing the first set of features to the first model at a first latency;
determining a model serving endpoint that deploys the first model, wherein the model serving endpoint is a web service;
storing, in the feature store, the metadata in association with the feature, the metadata further including a mapping from the feature to downstream lineage data indicating the first model and the model serving endpoint that deploys the first model;
receiving an update indication that the feature is to be updated;
determining, responsive to receipt of the update indication and based on the metadata including the mapping from the feature to the downstream lineage data, the model serving endpoint that deploys the first model trained on the feature;
transmitting a notification to the model serving endpoint, the notification indicating that the feature is updated;
receiving a request to access the second set of features for performing inference using a trained second model; and
providing the second set of features to the trained second model at a second latency, wherein the second latency is lower than the first latency.

19. The method of claim 18, further comprising training the first model using the first set of features.

20. A computer program product embodied in a non-transitory computer readable medium and executable by one or more processors, the computer program product comprising computer instructions for:
accessing one or more datasets stored on a data store;
determining a feature based at least in part on the one or more datasets;
storing the feature in a feature store, wherein the feature store stores a first set of features and a second set of features;
storing, in the feature store, metadata in association with the feature, the metadata including a mapping from the feature to upstream lineage data indicating the one or more datasets used to determine the feature;
receiving a request to access the first set of features for training a first model, wherein the first set of features includes the feature;
providing the first set of features to the first model at a first latency;
determining a model serving endpoint that deploys the first model, wherein the model serving endpoint is a web service;

storing, in the feature store, the metadata in association with the feature, the metadata further including a mapping from the feature to downstream lineage data indicating the first model and the model serving endpoint that deploys the first model;

receiving an update indication that the feature is to be updated;

determining, responsive to receipt of the update indication and based on the metadata including the mapping from the feature to the downstream lineage data, the model serving endpoint that deploys the first model trained on the feature;

transmitting a notification to the model serving endpoint, the notification indicating that the feature is updated;

receiving a request to access the second set of features for performing inference using a trained second model; and providing the second set of features to the trained second model at a second latency, wherein the second latency is lower than the first latency.

* * * * *

UNITED STATES PATENT AND TRADEMARK OFFICE
CERTIFICATE OF CORRECTION

PATENT NO. : 12,353,445 B2
APPLICATION NO. : 17/514997
DATED : July 8, 2025
INVENTOR(S) : Parkhe et al.

Page 1 of 1

It is certified that error appears in the above-identified patent and that said Letters Patent is hereby corrected as shown below:

In the Claims

In Column 20, in Claim 1, Line 3, delete "and:" and insert -- and --, therefor.

Signed and Sealed this
Ninth Day of September, 2025

Coke Morgan Stewart
*Acting Director of the United States Patent and Trademark Office*